(12) United States Patent
Tsay et al.

(10) Patent No.: US 8,769,454 B1
(45) Date of Patent: Jul. 1, 2014

(54) REGISTER-TRANSFER LEVEL (RTL) DESIGN CHECKING FOR EXPLORING SIMULATION AND/OR SYNTHESIS MISMATCHES AND AMBIGUOUS LANGUAGE SEMANTICS USING CATEGORIZATION

(71) Applicant: Cadence Design Systems, Inc., San Jose, CA (US)

(72) Inventors: Andy S. Tsay, Fremont, CA (US); Kuei Ju Yang, Hsinchu (TW); Shih-Chieh Wu, Chiayi County (TW)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/629,607

(22) Filed: Sep. 28, 2012

(51) Int. Cl.
*G06F 17/50* (2006.01)

(52) U.S. Cl.
USPC ........................................ 716/106

(58) Field of Classification Search
CPC .............. G06F 17/504; G06F 17/5045; G06F 17/5022; G06F 17/50; G06F 17/505; G06F 17/5081
USPC ........................................ 716/106
See application file for complete search history.

(56) References Cited

U.S. PATENT DOCUMENTS

| | | | |
|---|---|---|---|
| 6,553,548 B1 * | 4/2003 | Hekmatpour | 716/106 |
| 6,742,174 B1 * | 5/2004 | Chen et al. | 716/104 |
| 7,082,584 B2 * | 7/2006 | Lahner et al. | 716/102 |
| 7,137,078 B2 * | 11/2006 | Singhal et al. | 716/102 |
| 2013/0125072 A1 * | 5/2013 | Newcomb | 716/107 |

OTHER PUBLICATIONS

Kurup et al., "Mastering HDL for formal verification", May 1999.
Sebastian Jager, "Technical and Economical Barriers and Drivers for the Introduction of Formal Methods in the Verification of Digital Systems", Jan. 2004.
Mukherjee, et al., "SystemVerilog Modeling Guidelines to Avoid Synthesis—Simulation Mismatches", Apr. 2008.
Sanjay Churiwala, "Principles of VLSI RTL Design", 2011.
"Cadence: HAL User Guide, Product Version 10.2", Sep. 2011 (1 of 2).
"Cadence: HAL User Guide, Product Version 10.2", Sep. 2011 (2 of 2).

* cited by examiner

*Primary Examiner* — Jack Chiang
*Assistant Examiner* — Brandon Bowers
(74) *Attorney, Agent, or Firm* — Vista IP Law Group, LLPX

(57) ABSTRACT

The present disclosure teaches a system and method for register-transfer level (RTL) design checking for exploring mismatches and ambiguous language semantics that occur during the simulation and synthesis phases of the circuit design. In particular, the present disclosure utilizes identified patterns of design violations that occur as a result of these mismatches to create rule objects. The rule objects are then used to identify circuit design violations relating to mismatches between designer intent and ambiguous language. The rule objects are also categorized into different categories so as aid in the analysis of design rule violations and to identify the major impacts to the design qualities and to provide a confidence level of the overall design quality.

28 Claims, 14 Drawing Sheets

```
module SEN(clk, rst, in0, in1, out0);
input clk, rst, in0, in1;
output out0;
assign out0 = in0;
assign out0 = in1;
endmodule
```

```
module top(ii, oo);
input ii;
output [15:0] oo;
assign oo = {(4'd8 + 4'd8){ii}};
endmodule
```

Violation Report

<u>Design Pattern 1:</u>

Rule Object 1

Rule Object 2

Rule Object 3

...

<u>Design Pattern 2:</u>

Rule Object 100

Rule Object 101

Rule Object 102

Rule Object Properties

Module Name

File Name

Line Number

Design Pattern Number

Textual Description Describing
Design Violation

REGISTER-TRANSFER LEVEL (RTL) DESIGN CHECKING FOR EXPLORING SIMULATION AND/OR SYNTHESIS MISMATCHES AND AMBIGUOUS LANGUAGE SEMANTICS USING CATEGORIZATION

FIELD

The present disclosure relates to register-transfer level (RTL) design checking. In particular, it relates to RTL design checking for exploring simulation and/or synthesis mismatches and ambiguous language semantics using categorization.

BACKGROUND

During the electronic circuit design process, to design an integrated circuit (IC), a circuit designer generates a register-transfer level (RTL) design. An RTL design is a design abstraction that models a circuit in terms of the flow of signals (e.g., data) between hardware registers, and the logical operations performed on those signals. Hardware description languages (HDLs), such as Verilog, SystemVerilog, and VHDL, are used to generate the RTL abstraction. The RTL abstraction creates a high-level representation of the circuit, from which lower-level representations and actual circuit wiring can be derived. The RTL design is the golden design. The derived lower-level representation is the derived design.

The derived design is generated by synthesis software tools or by manual implementation from the golden RTL design. After the derived design is generated from the RTL design, the circuit designer uses verification software to verify that the derived design is logically equivalent (e.g., EQ) to the golden RTL design, which is the circuit design originally intended by the circuit designer. There are two main categories of design mismatches: the design intent mismatches and the simulation and/or synthesis mismatches. The design intent mismatches can happen when the designer misunderstands the RTL language semantics. Currently, verification software is not able to detect design intent mismatches that occur between the circuit designer's intent and RTL language semantic interpretations of the golden RTL design. As such, when a mismatch between the circuit designer's intent and language interpretations is present, the verification software may return a result of equivalence (EQ) between the derived design and the golden RTL design, which can be misleading to the circuit designer. The simulation and/or synthesis mismatches can happen when the golden RTL code is interpreted differently by the simulation tools and by the synthesis tools because the tools take different assumptions and constraints. This is due to the fact that the software has a different interpretation for the RTL design code and/or due to extra constraints being applied to the software. Currently, the simulation and/or synthesis mismatches are hard to detect by simulation tools because simulation tools have well-known issues of low verification coverage. The simulation and/or synthesis mismatches can be undetected by the equivalence check because it shares the same assumptions and constraints used by the synthesis tools. The present disclosure addresses this design mismatch problem by providing an improved approach for design checking golden RTL designs.

SUMMARY

The present disclosure relates to a system, apparatus, and method for RTL design checking for exploring simulation and/or synthesis mismatches and ambiguous language semantics using categorization. The disclosed method involves providing design code, to at least one processor, to process an RTL design code and generate an internal representation in computer memory for verification of an electronic circuit design. The method further involves comparing, by a design match engine, the RTL design code with design violation patterns contained in a design violation pattern database. Also, the method involves assigning a rule object to a design pattern in the design code, by at least one processor, when the design match engine determines that the design pattern in the RTL design code matches one of the design violation patterns in the design violation pattern database. Further, the method involves generating, with at least one processor, a violation report comprising the rule objects and their corresponding design violation patterns.

In one or more embodiments, the method further involves performing, by at least one processor, an equivalence check of a derived design compared to the RTL design for the electronic circuit design. In at least one embodiment, the method further involves, updating the design violation pattern database with a new design violation pattern after the new design violation pattern has been determined to result in a design violation to the RTL design. In some embodiments, the method further involves assigning, by at least one processor, a design pattern violation number to the new design pattern violation.

In at least one embodiment, the violation report further comprises properties for each of the rule objects in the violation report. In some embodiments, the properties comprise the name of the module containing the RTL design code corresponding to the rule object, the file name of the module containing the RTL design code corresponding to the rule object, at least one line number of the design code corresponding to the rule object, a design pattern violation number assigned to the design violation pattern corresponding to the rule object, and/or a textual description of the design violation pattern corresponding to the rule object.

In one or more embodiments, the method further involves, when one of the rule objects is selected in the violation report, graphically displaying on a display at least a portion the RTL design code of the module containing the RTL design code corresponding to the selected rule object, and hi-lighting the RTL design code corresponding to the selected rule object. In at least one embodiment, the method further involves, when hi-lighted RTL design code corresponding to one of the rule objects is selected, graphically displaying on a display the corresponding rule object in the violation report.

In at least one embodiment, the method further involves, when one of the rule objects is selected in the violation report, graphically displaying on a display at least a portion the design schematic corresponding to the selected rule object, and hi-lighting at least one unit and/or at least one connection corresponding to the selected rule object. In some embodiments, the method further involves, when at least one hi-lighted unit and/or hi-lighted connection corresponding to one of the rule objects in a design schematic is selected, graphically displaying on a display at least a portion the RTL design code of the module containing the RTL design code corresponding to the selected hi-lighted unit(s) and/or hi-lighted connection(s), and hi-lighting the RTL design code corresponding to the selected hi-lighted unit(s) and/or hi-lighted connection(s). In one or more embodiments, the method further involves, when at least one hi-lighted unit and/or hi-lighted connection corresponding to one of the rule objects in a design schematic is selected, graphically displaying on a display the corresponding rule object in the violation report.

In one or more embodiments, the method further involves categorizing the design violation patterns into at least one design violation pattern category. In at least one embodiment, at least one design violation pattern category is a simulation and/or synthesis mismatches category and/or a design intent mismatch category. In some embodiments, the method further involves calculating, with at least one processor, a design quality metric for the RTL design code by using data obtained from the categorization of the design violation patterns corresponding to the rule objects.

In at least one embodiment, a system for register-transfer level (RTL) design checking for exploring simulation and/or synthesis mismatches and ambiguous language semantics involves at least one processor, a design pattern violation database, and a design match engine. In one or more embodiments, at least one processor is configured to generate an internal representation for verification of an electronic circuit design by using RTL design code. In some embodiments, the design violation pattern database contains design violation patterns. In one or more embodiments, the design match engine is configured to compare the RTL design code with the design violation patterns contained in the design violation pattern database. In at least one embodiment, at least one processor is further configured to assign a rule object to a design pattern in the RTL design code, when the design match engine determines that the design pattern in the RTL design code matches one of the design violation patterns in the design violation pattern database. In some embodiments, at least one processor is further configured to generate a violation report comprising the rule objects and their corresponding design violation patterns.

In one or more embodiments, at least one processor is further configured to perform an equivalence check of a derived design compared to a golden RTL design for the electronic circuit design. In some embodiments, at least one processor is further configured to update the design violation pattern database with a new design violation pattern after the new design violation pattern has been determined to result in a design violation to the RTL design. In at least one embodiment, at least one processor is further configured to assign a design pattern violation number to the new design pattern violation.

In at least one embodiment, when one of the rule objects is selected in the violation report, a display graphically displays at least a portion the RTL design code of the module containing the RTL design code corresponding to the selected rule object, and hi-lights the RTL design code corresponding to the selected rule object. In some embodiments, when hi-lighted RTL design code corresponding to one of the rule objects is selected, a display graphically displays the corresponding rule object in the violation report.

In one or more embodiments, when one of the rule objects is selected in the violation report, a display graphically displays at least a portion the design schematic corresponding to the selected rule object, and hi-lights at least one unit and/or at least one connection corresponding to the selected rule object. In at least one embodiment, when at least one hi-lighted unit and/or hi-lighted connection corresponding to one of the rule objects in a design schematic is selected, a display graphically displays at least a portion the RTL design code of the module containing the design code corresponding to the selected hi-lighted unit(s) and/or the hi-lighted connection(s), and hi-lights the RTL design code corresponding to the selected hi-lighted unit(s) and/or hi-lighted connection(s).

In some embodiments, when at least one hi-lighted unit and/or hi-lighted connection corresponding to one of the rule objects in a design schematic is selected, a display graphically displays the corresponding rule object in the violation report.

In at least one embodiment, at least one processor is further configured to categorize the design violation patterns into at least one design violation pattern category. In some embodiments, at least one processor is further configured to calculate a design quality metric for the RTL design code by using data obtained from the categorization of the design violation patterns corresponding to the rule objects.

Further details of aspects, objects, and advantages of the present disclosure are described below in the detailed description, drawings, and claims. Both the foregoing general description and the following detailed description are exemplary and explanatory, and are not intended to be limiting as to the scope of the present disclosure.

DRAWINGS

These and other features, aspects, and advantages of the present disclosure will become better understood with regard to the following description, appended claims, and accompanying drawings where:

FIG. 1 illustrates an exemplary module of RTL design code containing one design violation pattern example, in accordance with at least one embodiment of the present disclosure.

FIG. 2 illustrates another exemplary module of RTL design code containing another design violation pattern example, in accordance with at least one embodiment of the present disclosure.

FIG. 5 illustrates an exemplary violation report generated by the disclosed method of FIG. 3 and the system of FIG. 4, in accordance with at least one embodiment of the present disclosure.

FIG. 6 illustrates an exemplary listing of rule object properties for each rule object contained in the violation report of FIG. 5, in accordance with at least one embodiment of the present disclosure.

DESCRIPTION

Figure 3:
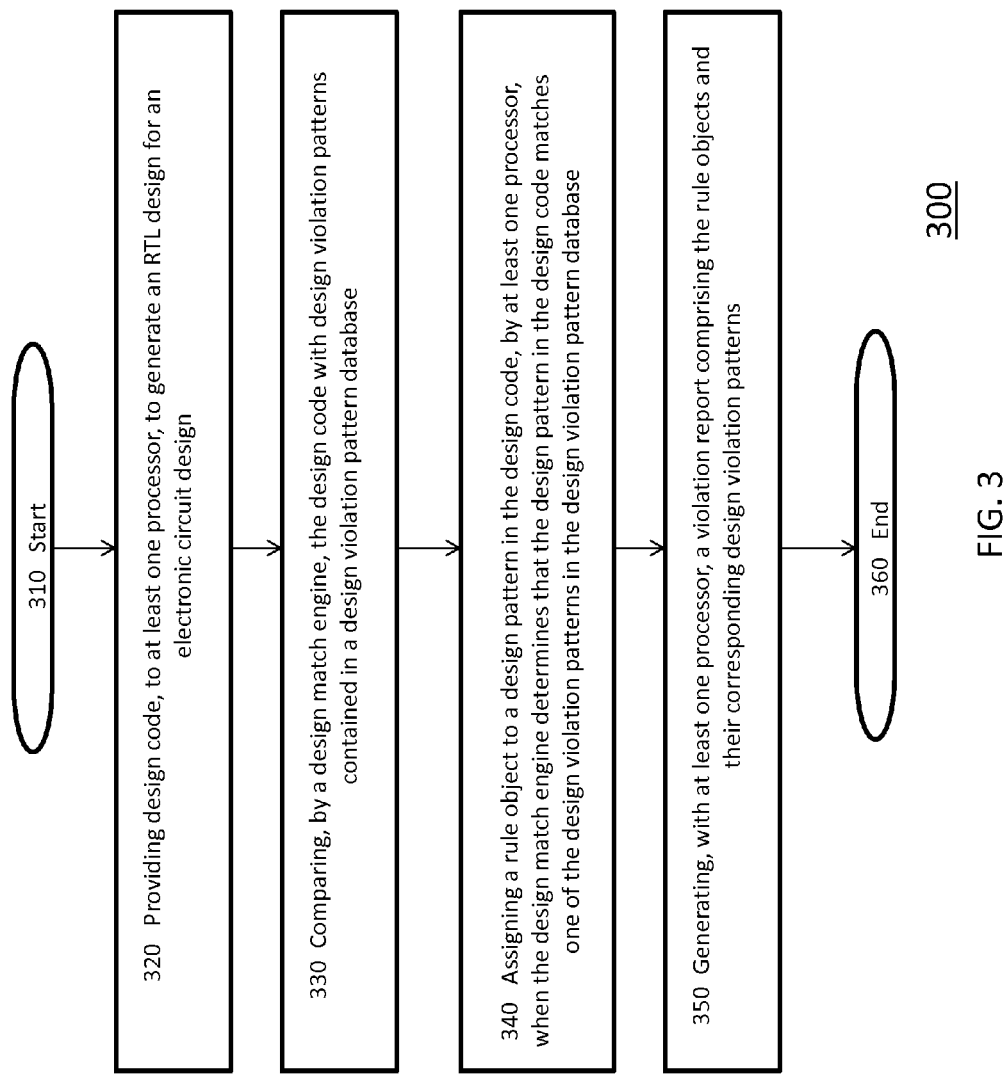
FIG. 3 illustrates a flow diagram of the disclosed method for register-transfer level (RTL) design checking for exploring simulation and/or synthesis mismatches and ambiguous language semantics using categorization, in accordance with at least one embodiment of the present disclosure.

The methods and apparatus disclosed herein provide an operative system for register-transfer level (RTL) design checking. Specifically, this system relates to RTL design checking for exploring mismatches and ambiguous language semantics that occur during the simulation and synthesis phases of the circuit design.

During the electronic circuit design process, a circuit designer generates a register-transfer level (RTL) design also known as the golden design. An RTL design is further processed either automatically by synthesis tools or manually to generate a derived design. Once the derived design is generated, the circuit designer uses verification software to verify that the derived design is logically equivalent (e.g., EQ) to the golden RTL design, which is the circuit design originally intended by the circuit designer. Currently, conventional verification software is not able to detect mismatches that occur between the circuit designer's intent and language interpretations. As such, when a mismatch between the circuit designer's intent and language interpretations occurs, the verification software may return a result of logical equivalence (EQ) between the derived design and the golden RTL design, which can be misleading to the circuit designer.

The present disclosure addresses this problem by providing an improved approach for design checking RTL designs. In particular, the present disclosure utilizes identified patterns of design violations that occur as a result of these mismatches to create rule objects. The rule objects are then used to identify circuit design violations relating to mismatches between designer intent and RTL language semantics. The rule objects are also categorized into different categories so as to identify the major impacts to the design qualities and to provide a confidence level of the overall design quality.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

FIG. 1 illustrates an exemplary module 100 of RTL design code containing one design violation pattern example, in accordance with at least one embodiment of the present disclosure. In this figure, module SEN 100 of RTL design code is shown to contain one specific design violation pattern. Design error happens when the module's inputs in0 and in1 are connected to two different logical 0/1 values. In particular, the fourth line of code shows that a signal representing a logical 0 is being assigned to a specific wire of the electronic circuit design, and the fifth line of code shows that a signal representing a logical 1 is being assigned to the same specific wire of the electronic circuit design. As such, it is evident that a design violation pattern of simultaneously driving two different signals to the same wire is present in the module SEN 100. In one or more embodiments, this particular design pattern violation is assigned a unique design pattern violation number of RTL 1.1.

FIG. 2 illustrates another exemplary module 200 of RTL design code containing another design violation pattern example, in accordance with at least one embodiment of the present disclosure. In this figure, module top 200 of RTL design code is shown to contain a specific design violation pattern. Specifically, the fourth line of code shows that (ii) should be replicated x number of times, where x is equal to 4'd8+4'd8, and 4'd refers to a 4-bit implementation. The circuit designer intends for (ii) to be replicated sixteen (16) times and, as such, the circuit designer has a mistaken belief that 4'd8+4'd8 is equal to 16. However, the quantity of 4'd8+4'd8, as interpreted by circuit design software, is equal to zero (0). Therefore, the circuit design software interprets this line of code to mean that (ii) should be replicated zero number of times. It should be noted that a circuit designer would not bother to write a line of code to replicate zero number of times. As such, it is clear that a design pattern violation of requesting a replication of zero number of times is present in module top 200. In one or more embodiments, this particular design pattern violation is assigned a design pattern violation number of RTL 2.1.

FIG. 3 illustrates a flow diagram of the disclosed method 300 for register-transfer level (RTL) design checking for exploring simulation and/or synthesis mismatches and ambiguous language semantics using categorization, in accordance with at least one embodiment of the present disclosure. At the start 310 of the method 300, RTL design code is provided, to at least one processor, to generate an internal representation of the RTL design for an electronic circuit design verification 320. After the RTL design code is provided, a design match engine compares the RTL design code with design violation patterns that are contained in a design violation pattern database 330. After the design match engine performs the comparison, at least one processor assigns a rule object to a design pattern, when the design match engine determines that the design pattern in the RTL design code matches one of the design violation patterns in the design violation pattern database 340. Then, at least one processor generates a violation report comprising the rule objects and their corresponding design violation patterns 350. After the violation report is generated, the method 300 ends 360.

Figure 4:
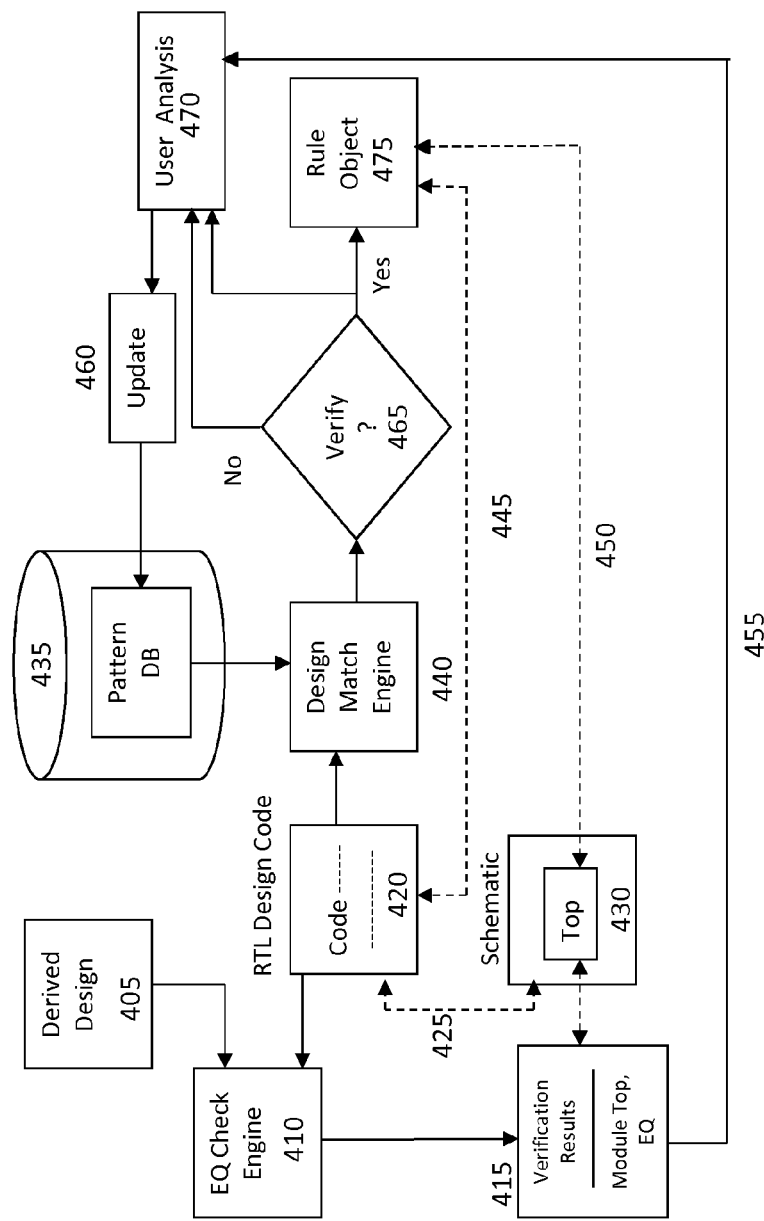
FIG. 4 illustrates a simplified diagram of the disclosed system for RTL design checking for exploring simulation and/or synthesis mismatches and ambiguous language semantics using categorization, in accordance with at least one embodiment of the present disclosure.

FIG. 4 illustrates a simplified diagram of the disclosed system 400 for RTL design checking for exploring simulation and/or synthesis mismatches and ambiguous language semantics using categorization, in accordance with at least one embodiment of the present disclosure. This diagram, in particular, illustrates the connections and the flow of the disclosed system 400. In this figure, a derived design 405, which is the circuit design derived from the golden RTL design, is shown to be input into an equivalence check engine 410. In addition, the golden RTL design code 420 for the RTL design, is shown to be input into the equivalence check engine 410. After the equivalence check engine 410 receives the derived design 405 and the golden RTL design code 420, the equivalence check engine 410 performs an equivalence check to verify that that the derived design 405 is logically equivalent (e.g., EQ) to the golden RTL design code 420. The equivalence check engine 410 then outputs the verification results 415 of the equivalence check.

Also shown in FIG. 4, the RTL design code 420 is input into a design match engine 440. Also, design violation patterns, stored within a design violation pattern database 435, are input into the design match engine 440. After the design match engine 440 receives the RTL design code 420 and the design violation patterns from the design violation pattern database 435, the design match engine 440 performs a comparison of the RTL design code 420 and the design violation patterns.

When the design match engine 440 determines (e.g., verifies 465) that a design pattern in the RTL design code 420 matches a design violation pattern from the design violation pattern database 435, a rule object 475 is assigned to that design pattern. In addition, the verified design pattern is sent to a circuit designer for user analysis 470.

However, when the design match engine 440 determines that a design pattern in the RTL design code 420 does not match a design violation pattern from the design violation pattern database 435, the design pattern is sent to a circuit designer for user analysis 470. If the circuit designer determines that the design pattern will result in a design violation to the RTL design, and, thus, the design pattern is a design violation pattern, the circuit designer updates 460 to the design pattern database 435 with a new design violation pattern corresponding to the design pattern. In addition, a design violation pattern number is assigned (not shown) to the new design violation pattern. Alternatively, the circuit designer can send a request to the software developer to add a new design violation pattern to the design violation pattern database.

In addition, the verification results 415 of the equivalence check are sent 455 to a circuit designer for user analysis 470. If the circuit designer determines that there is a design pattern within the RTL design code 420 that will result in a design violation to the RTL design, and, thus, the design pattern is a design violation pattern, the circuit designer updates 460 to the design pattern database 435 with a new design violation pattern corresponding to the design pattern. A design violation pattern number is assigned (not shown) to the new design violation pattern.

Also, a violation report is generated (not shown) that contains a listing of all of the rule objects. The violation report also contains properties for each of the rule objects within the report. Various types of properties may be contained within the violation report for each rule object including, but not limited to, the name of the module containing the RTL design code corresponding to the rule object, the file name of the module containing the RTL design code corresponding to the rule object, the line number(s) of the design code corresponding to the rule object, a design pattern violation number assigned to the design violation pattern corresponding to the rule object, and a textual description of the design violation pattern corresponding to the rule object.

The disclosed system provides an interactive graphical user interface (GUI) to the circuit designer in order to better able the circuit designer to understand how the verified design violation patterns affect the design schematic 430. For example, when a rule object 475 within the violation report is selected, a display will graphically display 450 to the circuit designer at least a portion of the design schematic 430 corresponding to the selected rule object, and the unit(s) and/or connection(s) corresponding to the selected rule object will be hi-lighted. And, in the opposite direction, when a hi-lighted unit(s) and/or connection(s) within the design schematic 430 corresponding to one of the rule objects is selected, a display will graphically display 450 the corresponding selected rule object 475 within the violation report.

Also, the disclosed system provides an interactive graphical user interface (GUI) to the circuit designer in order to better able the circuit designer to locate the design patterns in the RTL design code 420 that are verified design violation patterns. When a rule object 475 within the violation report is selected, a display will graphically display 445 at least a portion of the RTL design code 420 of a module containing the RTL design code corresponding to the selected rule object, and the RTL design code 420 lines corresponding to the selected rule object will be hi-lighted. In the opposite direction, when the hi-lighted RTL design code 420 corresponding to one of the rule objects are selected, a display will graphically display 445 the corresponding selected rule object 475 within the violation report.

In addition, the interactive GUI for the disclosed system also provides a means for the circuit designer to be able to toggle back and forth from the RTL design code 420 to the design schematic 430 to view verified design patterns within the RTL design code 420 and to view their effects on the design schematic 430. For this feature, when a hi-lighted unit(s) and/or connection(s) within the design schematic 430 corresponding to one of the rule objects is selected, a display will graphically display 425 at least a portion of the RTL design code 420 of a module containing the RTL design code corresponding to the selected rule object, and the RTL design code 420 lines corresponding to the selected rule object will be hi-lighted. Also, in the opposite direction, when the hi-lighted RTL design code 420 corresponding to one of the rule objects are selected, a display will graphically display 420 to the circuit designer at least a portion of the design schematic 430 corresponding to the rule object, and the unit(s) and/or connection(s) corresponding to the rule object will be hi-lighted.

FIG. 5 illustrates an exemplary violation report 500 generated by the disclosed method of FIG. 3 and the system of FIG. 4, in accordance with at least one embodiment of the present disclosure. In this figure, the rule objects are shown to be listed under their corresponding design violation pattern number. As such, Rule Object 1, Rule Object 2, Rule Object 3, etc. are shown to be listed under Design Pattern 1. Also, Rule Object 100, Rule Object 101, Rule Object 102, etc. are shown to be listed under Design Pattern 2.

FIG. 6 illustrates an exemplary listing of rule object properties 600 for each rule object contained in the violation report of FIG. 5, in accordance with at least one embodiment of the present disclosure. In this figure, the rule object properties 600 included in the violation report 500 for each rule object include the module name of the RTL design code containing the design pattern corresponding to the rule object, a file name for the module of the RTL design code containing the design pattern corresponding to the rule object, the line number(s) of the RTL design code containing the design pattern corresponding to the rule object, the design pattern violation number corresponding to the rule object, and a textual description of the design violation pattern corresponding to the rule object.

Figure 7:
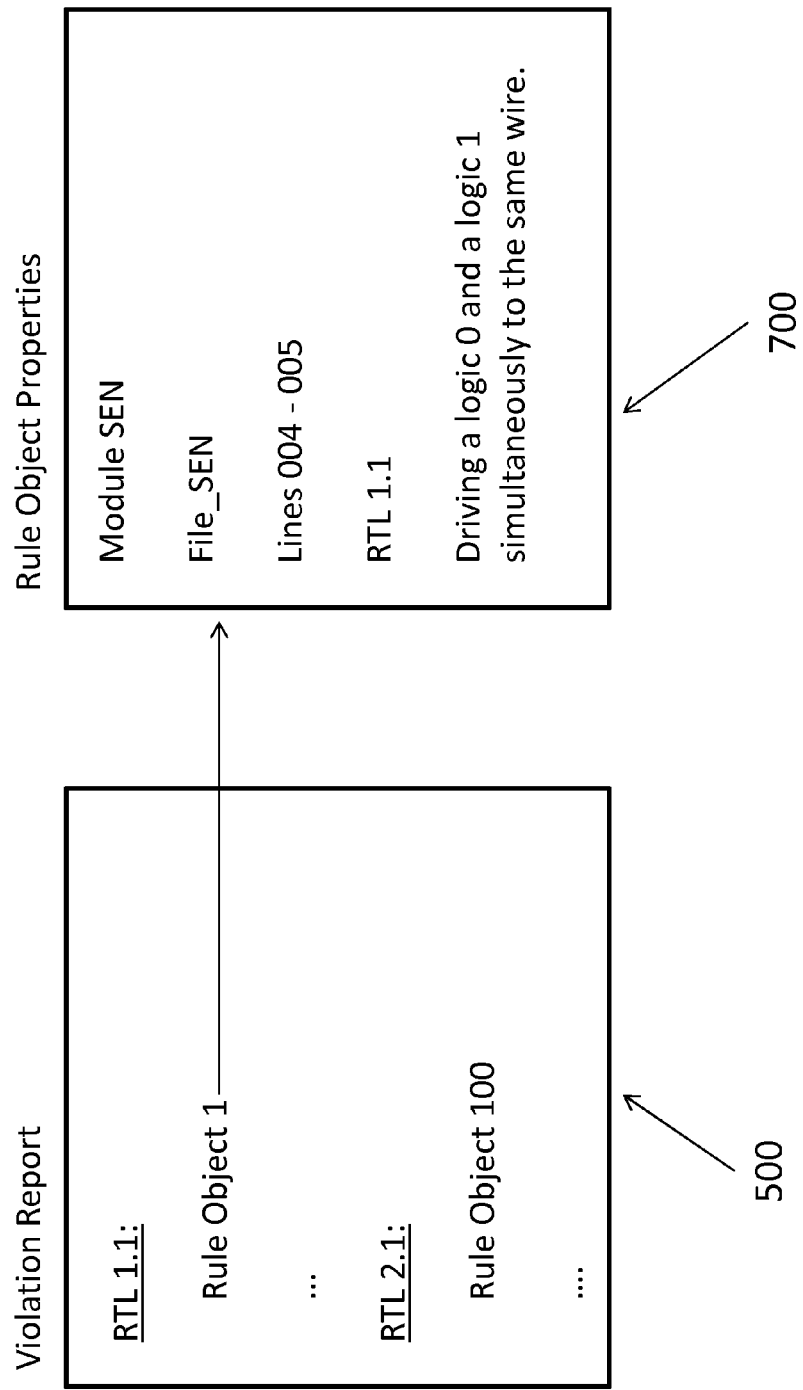
FIG. 7 illustrates the ability to view the rule object properties for each rule object contained in the violation report of FIG. 5, in accordance with at least one embodiment of the present disclosure.

FIG. 7 illustrates the ability to view the rule object properties 700 for each rule object contained in the violation report 500 of FIG. 5, in accordance with at least one embodiment of the present disclosure. In this figure, when a rule object is selected in the violation report 500, the rule object properties 700 for the selected rule object are displayed. For example, when Rule Object 1, which has a design violation pattern number of RTL 1.1, is selected within the violation report

500, the rule object properties for Rule Object 1 are displayed. In this example, the rule object properties 700 displayed for Rule Object 1 are the module name which is Module SEN, the file name of the module which is File_SEN, the relevant lines of RTL design code within the module which are the lines 4 and 5, the design violation pattern number which is RTL 1.1, and the design violation pattern description which is that a logic 0 and a logic 1 are being simultaneously driven to the same wire.

Figure 8:
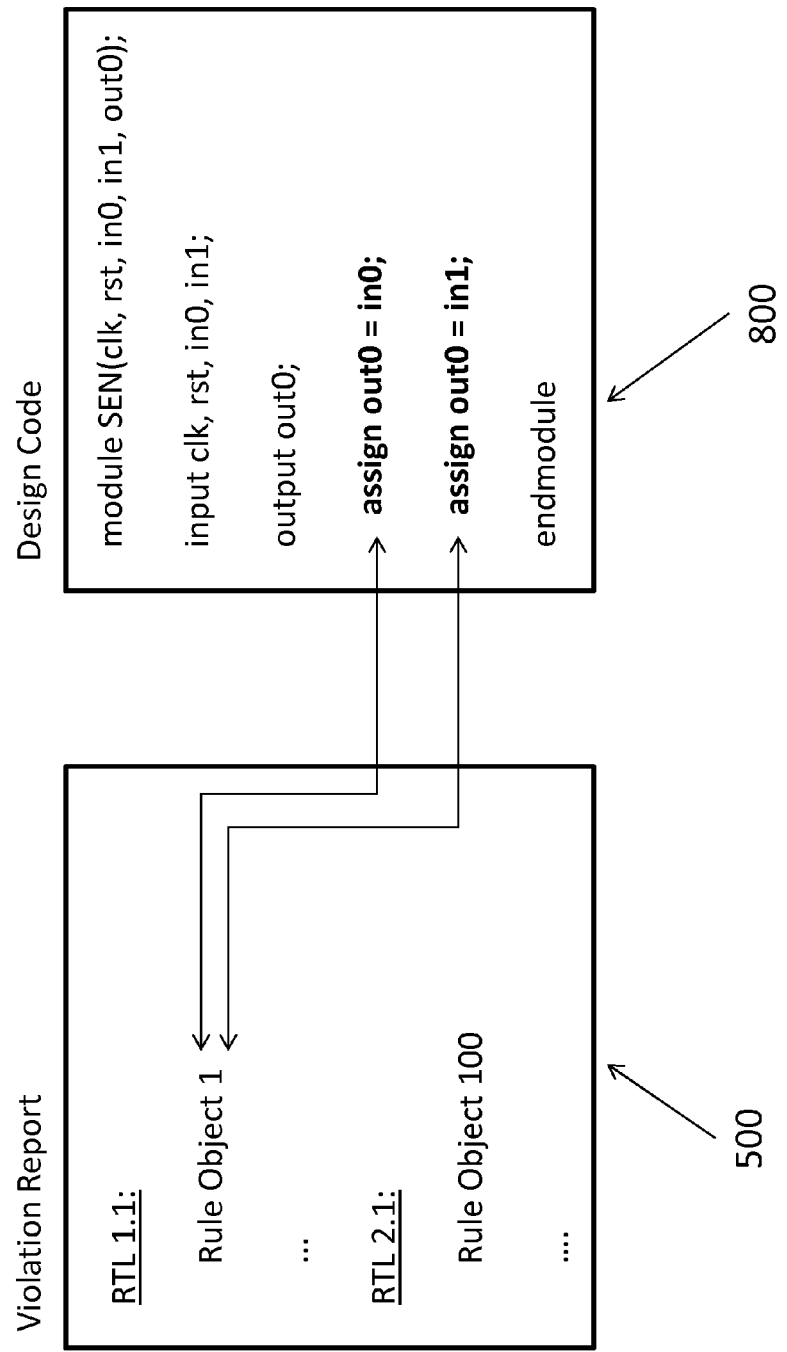
FIG. 8 illustrates the ability to view, when a rule object contained in the violation report of FIG. 5 is selected, the corresponding lines of code in the RTL design code corresponding to the selected rule object, and vice versa, in accordance with at least one embodiment of the present disclosure.

FIG. 8 illustrates the ability to view, when a rule object contained in the violation report 500 of FIG. 5 is selected, the corresponding lines of code in the RTL design code 800 corresponding to the selected rule object, and vice versa, in accordance with at least one embodiment of the present disclosure. In this figure, when Rule Object 1 is selected in the violation report 500, the RTL design code 800 for module SEN is displayed, and the lines (lines 4 and 5) of RTL design code 800 corresponding to the selected rule object are hi-lighted. In the opposite direction, when the hi-lighted lines of RTL design code 800 corresponding to one of the rule objects is selected, the corresponding rule object in the violation report 500 is displayed.

Figure 9:
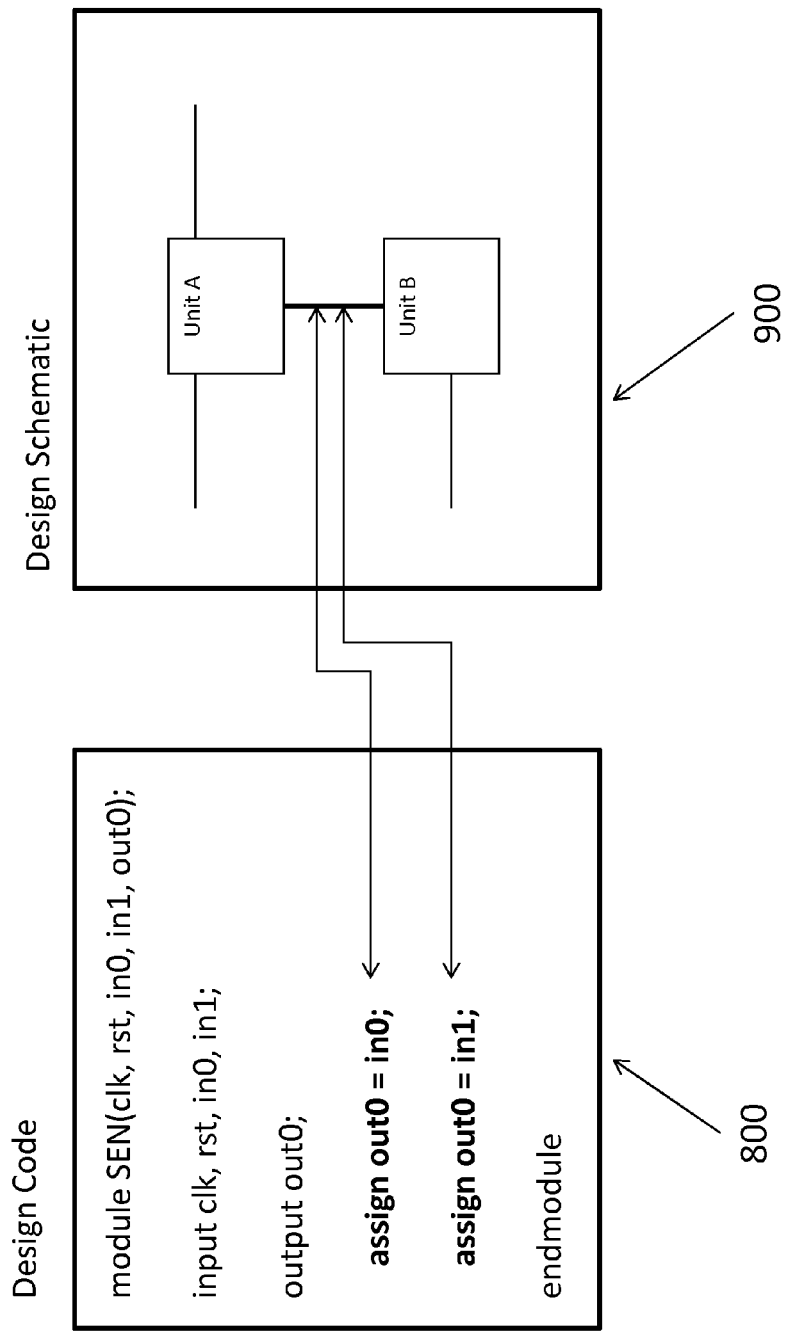
FIG. 9 illustrates the ability to view, when hi-lighted design code corresponding to one of the rule objects is selected, the unit(s) and/or connection(s) in the design schematic corresponding to selected the rule object, and vice versa, in accordance with at least one embodiment of the present disclosure.

FIG. 9 illustrates the ability to view, when hi-lighted RTL design code 800 corresponding to one of the rule objects is selected, the unit(s) and/or connection(s) in the design schematic 900 corresponding to selected the rule object, and vice versa, in accordance with at least one embodiment of the present disclosure. In this figure, when the hi-lighted lines of RTL design code 800 corresponding to one of the rule objects are selected, at least a portion of the design schematic 900 corresponding to the rule object is displayed, and the unit(s) and/or connection(s), here the wire located between unit A and unit B, corresponding to the rule object are hi-lighted. Also, in the opposite direction, when the hi-lighted unit(s) and/or connection(s), here the wire located between unit A and unit B, corresponding to one of the rule objects is selected, the RTL design code 800 for module SEN is displayed, and the lines (lines 4 and 5) of RTL design code 800 corresponding to the selected rule object are hi-lighted.

Figure 10:
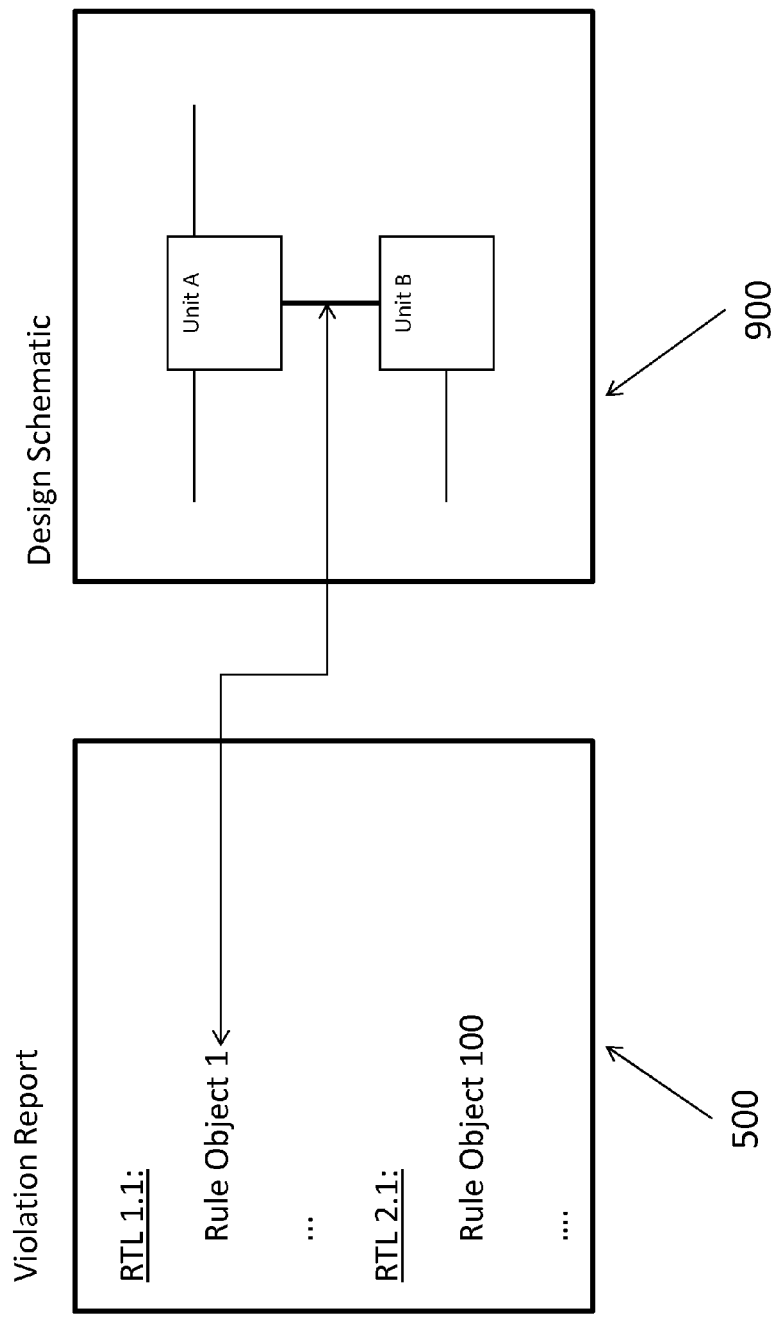
FIG. 10 illustrates the ability to view, when a rule object contained in the violation report of FIG. 5 is selected, the unit(s) and/or connection(s) in the design schematic corresponding to selected the rule object, and vice versa, in accordance with at least one embodiment of the present disclosure.

FIG. 10 illustrates the ability to view, when a rule object contained in the violation report 500 of FIG. 5 is selected, the unit(s) and/or connection(s) in the design schematic 900 corresponding to selected the rule object, and vice versa, in accordance with at least one embodiment of the present disclosure. In this figure, when Rule Object 1 is selected in the violation report 500, at least a portion of the design schematic 900 corresponding to the selected rule object is displayed, and the unit(s) and/or connection(s), here the wire located between unit A and unit B, corresponding to the selected rule object are hi-lighted. And, in the opposite direction, when the hi-lighted unit(s) and/or connection(s), here the wire located between unit A and unit B, corresponding to one of the rule objects is selected, the corresponding rule object in the violation report 500 is displayed.

Figure 11:
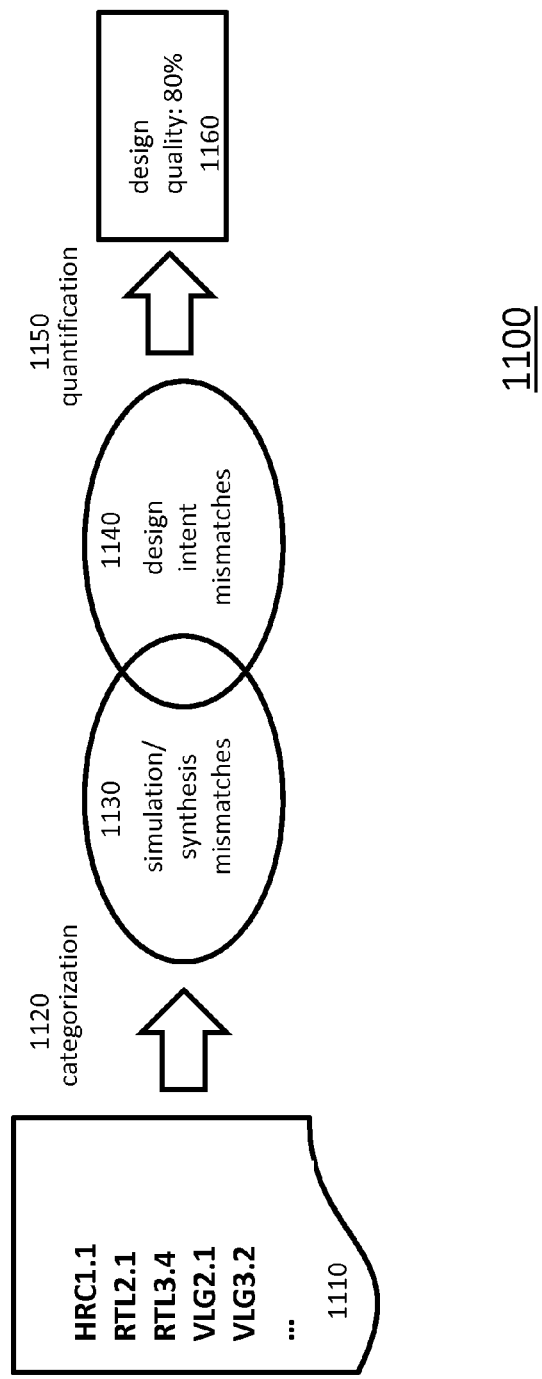
FIG. 11 illustrates a diagram of how rule objects are categorized and a design quality metric for the RTL design code is quantified, in accordance with at least one embodiment of the present disclosure.

FIG. 11 illustrates a diagram 1100 of how rule objects are categorized 1120 and a design quality metric 1160 for the RTL design code is quantified 1150, in accordance with at least one embodiment of the present disclosure. In this figure, rule objects, which are associated with design violation pattern numbers 1110, are shown to be categorized 1120 into two different categories. The two categories are the simulation and/or synthesis category 1130 and the design intent mismatches category 1140. Each category identifies major impacts to the design qualities of the RTL design code due to design intent mismatches and/or simulation and/or synthesis mismatches. It should be noted that in other embodiments, more or less than two categories may be employed, and different types of categories may be employed other than the two illustrated in FIG. 11.

After the rule objects are categorized, the categorization 1120 is used to quantify 1150 a design quality 1160 for the RTL design code. The design quality provides a confidence level for the RTL design.

Figure 12:
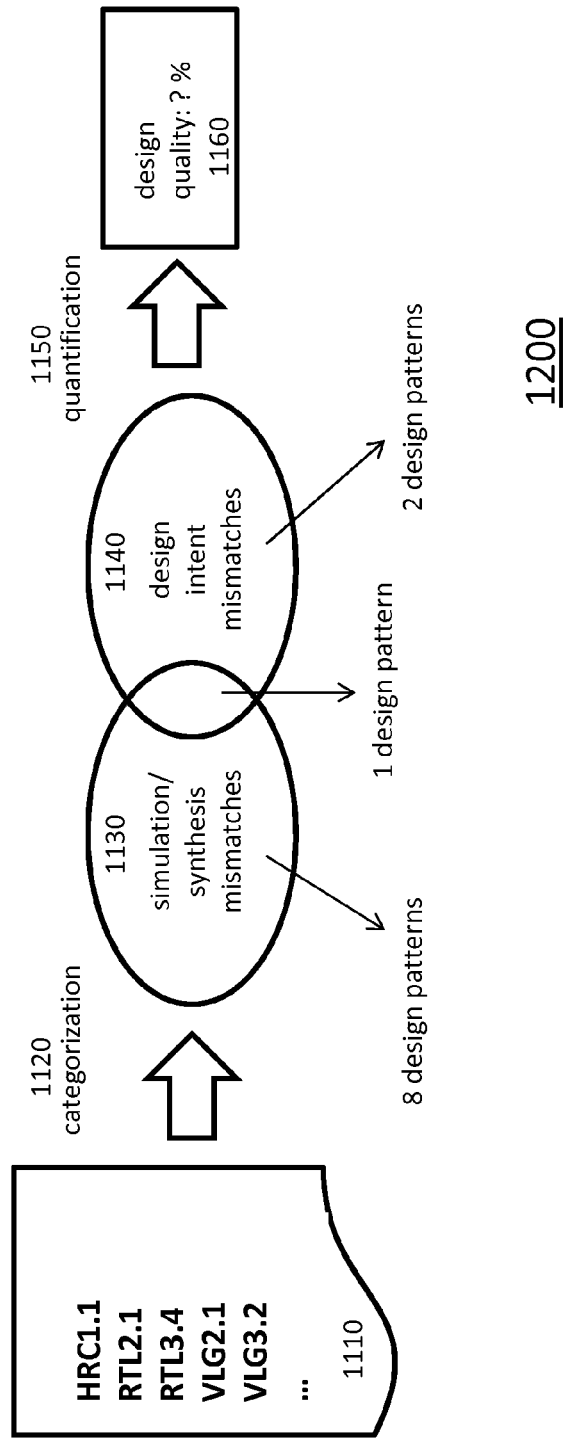
FIG. 12 illustrates an example showing how a design quality metric for the RTL design code is quantified by analyzing how many design violation patterns are present in each rule object category, in accordance with at least one embodiment of the present disclosure.

FIG. 12 illustrates an example 1200 showing how a design quality metric for the RTL design is quantified by analyzing how many design violation patterns are present in each rule object category, in accordance with at least one embodiment of the present disclosure. In this example, eight (8) design patterns are shown to be categorized in the simulation and/or synthesis mismatches category 1130, two (2) design patterns are shown to be categorized in the design intent mismatches category 1140, and one (1) design pattern is shown to be categorized in both of the categories 1130, 1140 (e.g., the overlapping category).

In one or more embodiments, a formula for quantifying the design quality is:

$$\text{Design Quality} = P = 100e^{-an}$$

where n is equal to the number of design patterns in a category, and a is equal to a weight assigned to the category.

The weight assigned to a category is related to the amount of impact the design patterns of a category have on the RTL design. For example, if it is determined that the design patterns of the design intent mismatches category 1140 (e.g., category number 2) have twice the impact on the RTL design than the design patterns of the simulation and/or synthesis mismatches category 1130 (e.g., category number 1), a weight of $\frac{1}{20} = 0.05$ will be assigned to $a_1$ and a weight of $\frac{1}{10} = 0.1$ will be assigned to $a_2$. The weight of the overlapping category is:

$$a_{12} = a_1 + a_2 = \frac{1}{20} + \frac{1}{10} = \frac{3}{20} = 0.15$$

Since the simulation and/or synthesis mismatches category 1130 (e.g., category number 1) has 8 design patterns, $n_1$ will equal 8. And, since the design intent mismatches category 1140 (e.g., category number 2) has 2 design patterns, $n_2$ will equal 2. Also, since the overlapping category has 1 design pattern, $n_{12}$ will equal 1. Therefore, for this example, the design qualities for each of these categories are:

$$P_1 = 100e^{-a_1 n_1} = 100e^{-0.05(8)}$$

$$P_2 = 100e^{-a_2 n_2} = 100e^{-(0.1)2}$$

$$P_{12} = 100e^{-a_{12} n_{12}} = 100e^{-(0.15)1}$$

Figure 13:
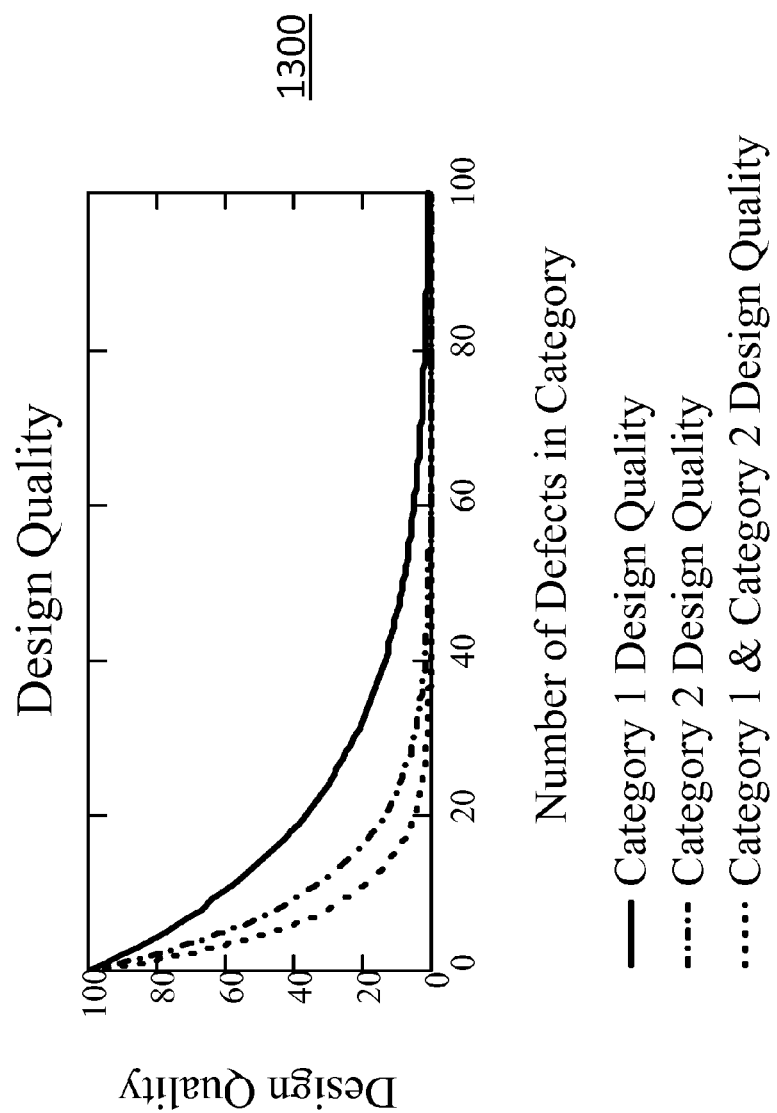
FIG. 13 illustrates a graph showing an exemplary design quality for a RTL design code according to the number of design violation patterns within two rule object categories, in accordance with at least one embodiment of the present disclosure.

FIG. 13 illustrates a graph 1300 showing an exemplary design quality for a RTL design according to the number of design violation patterns within two rule object categories, in accordance with at least one embodiment of the present disclosure. In this figure, the graph 1300 shows the design quality, on the vertical scale, as a function of the number of design patterns (e.g., defects), on the horizontal scale, for each of the three categories (e.g., the simulation and/or synthesis mismatches category 1130, the design intent mismatches category 1140, and the overlapping category). The top (solid) curve shows the impact on design quality for the simulation and/or synthesis mismatches category 1130 design patterns. The middle (dot-dash) curve shows the impact on design quality for the design intent mismatches category 1140 design patterns. The bottom (dotted) curve shows the impact on design quality for the overlapping category design patterns.

Figure 14:
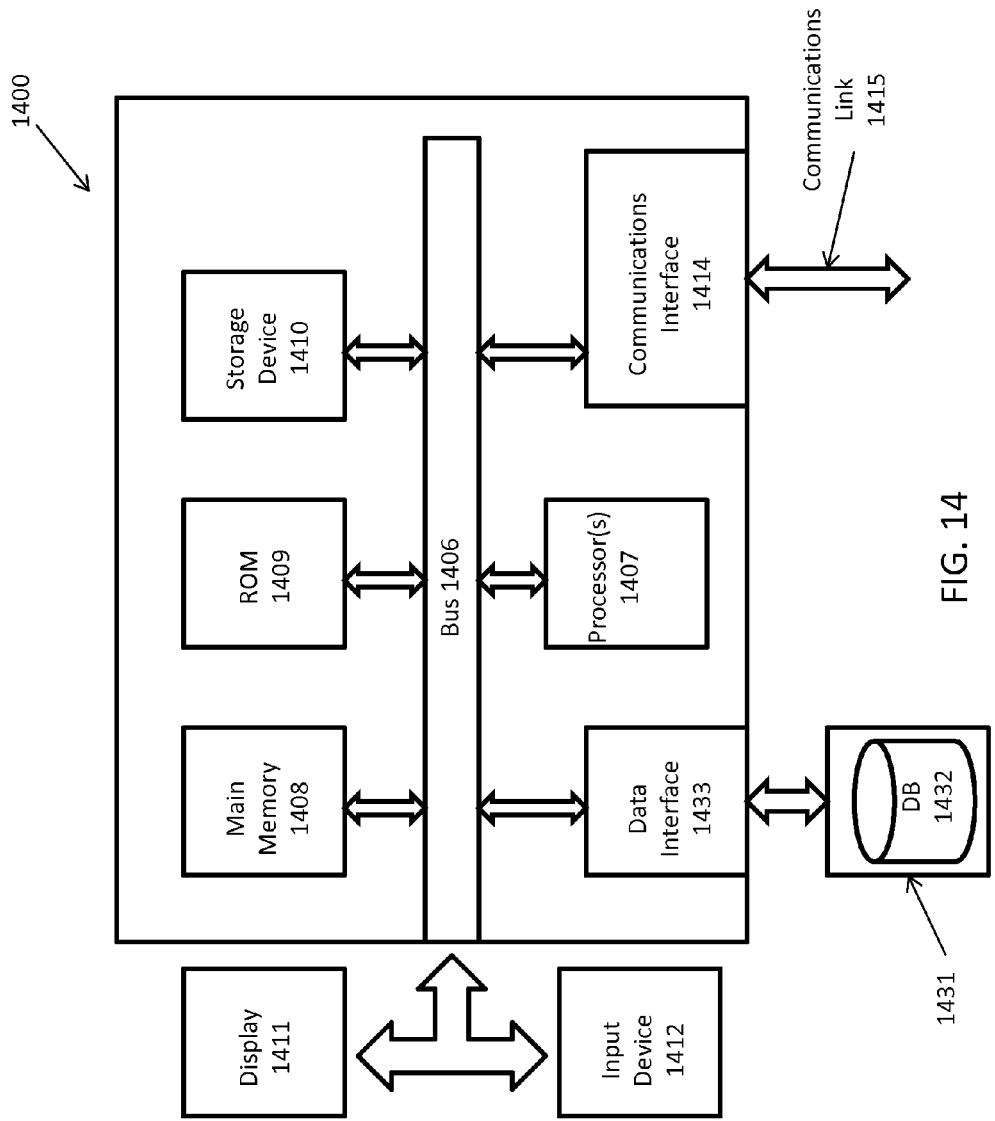
FIG. 14 illustrates a block diagram of an illustrative computing system suitable for implementing an embodiment of the present disclosure.

FIG. 14 illustrates a block diagram of an illustrative computing system 1400 suitable for implementing an embodiment of the present disclosure. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (not shown).

According to one embodiment of the present disclosure, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the present disclosure. Thus, embodiments of the present disclosure are not limited to any specific combination of hardware circuitry and/or software. In one embodiment, the term "logic" shall mean any combination of software or hardware that is used to implement all or part of the present disclosure.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the present disclosure, execution of the sequences of instructions to practice the present disclosure is performed by a single computer system 1400. According to other embodiments of the present disclosure, two or more computer systems 1400 coupled by communication link 1415 (e.g., LAN, PTSN, or wireless network) may perform the sequence of instructions required to practice the present disclosure in coordination with one another.

Computer system 1400 may transmit and receive messages, data, and instructions, including program, e.g., application code, through communication link 1415 and communication interface 1414. Received program code may be executed by processor 1407 as it is received, and/or stored in disk drive 1410, or other non-volatile storage for later execution. Computer system 1400 may also interact with a database 1432 within a database system 1431 via a data interface 1433 where the computer system 1400 may store and retrieve information or data of the electronic design into and from the database system 1431.

In the foregoing specification, the present disclosure has been described with reference to specific embodiments thereof. It will, however, be evident that various modifications and changes may be made thereto without departing from the broader spirit and scope of the present disclosure. For example, the above-described process flows are described with reference to a particular ordering of process actions. However, the ordering of many of the described process actions may be changed without affecting the scope or operation of the present disclosure. The specification and drawings are, accordingly, to be regarded in an illustrative rather than restrictive sense.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

We claim:

1. A method for register-transfer level (RTL) design checking for exploring simulation mismatches, synthesis mismatches, or ambiguous language semantics associated with generating a derived design from RTL design code, the method comprising:
   providing the RTL design code, to at least one processor, to generate an internal representation for verification of an electronic circuit design;
   comparing, by a design match engine, the RTL design code with design violation patterns contained in a design violation pattern database, wherein the design violation patterns identify violations relating to the simulation mismatches, synthesis mismatches, or ambiguous language semantics associated with generating the derived design that are otherwise undetected during equivalence checking between the derived design and the RTL design code;
   assigning a rule object to a design pattern in the RTL design code, by the at least one processor, when the design match engine determines that the design pattern in the RTL design code matches one of the design violation patterns in the design violation pattern database; and
   generating, with the at least one processor, a violation report comprising the rule objects and their corresponding design violation patterns.

2. The method of claim 1, wherein the method further comprises performing, by the at least one processor, an equivalence check of the derived design compared to a golden RTL design for the electronic circuit design.

3. The method of claim 1, wherein the method further comprises, updating the design violation pattern database with a new design violation pattern after the new design violation pattern has been determined to result in a design violation to the RTL design.

4. The method of claim 3, wherein the method further comprises assigning, by the at least one processor, a design pattern violation number to the new design pattern violation.

5. The method of claim 1, wherein the violation report further comprises properties for each of the rule objects in the violation report.

6. The method of claim 5, wherein the properties comprise at least one of a name of a module containing the RTL design code corresponding to the rule object, a name of a file of the module, at least one line number of the RTL design code corresponding to the rule object, a design pattern violation number assigned to the design violation pattern corresponding to the rule object, and a textual description of the design violation pattern corresponding to the rule object.

7. The method of claim 1, wherein the method further comprises,
   selecting one of the rule objects in the violation report, and graphically displaying on a display at least a portion the design code in a module containing the RTL design code corresponding to the selected rule object and hi-lighting the RTL design code corresponding to the selected rule object.

8. The method of claim 1, wherein the method further comprises,
selecting hi-lighted RTL design code corresponding to one of the rule objects, and
graphically displaying on a display the corresponding rule object in the violation report.

9. The method of claim 1, wherein the method further comprises,
selecting one of the rule objects in the violation report, and
graphically displaying on a display at least a portion the design schematic corresponding to the selected rule object and hi-lighting at least one of at least one unit and at least one connection corresponding to the selected rule object.

10. The method of claim 1, wherein the method further comprises,
selecting at least one of a hi-lighted unit and a hi-lighted connection corresponding to one of the rule objects in a design schematic, and
graphically displaying on a display at least a portion the RTL design code in a module containing the RTL design code corresponding to the selected at least one of the hi-lighted unit and the hi-lighted connection and hi-lighting the RTL design code corresponding to the selected at least one of the hi-lighted unit and the hi-lighted connection.

11. The method of claim 1, wherein the method further comprises,
selecting at least one of a hi-lighted unit and a hi-lighted connection corresponding to one of the rule objects in a design schematic, and
graphically displaying on a display the corresponding rule object in the violation report.

12. The method of claim 1, wherein the method further comprises categorizing the design violation patterns into at least one design violation pattern category.

13. The method of claim 12, wherein the at least one design violation pattern category comprises at least one of a simulation and/or synthesis mismatches category and a design intent mismatch category.

14. The method of claim 12, wherein the method further comprises calculating, with the at least one processor, a design quality metric for the RTL design by using data obtained from the categorization of the design violation patterns corresponding to the rule objects.

15. A system for register-transfer level (RTL) design checking for exploring simulation mismatches, synthesis mismatches, or ambiguous language semantics associated with generating a derived design from RTL design code, the system comprising:
at least one processor configured to generate an internal representation of an RTL design for an electronic circuit design by using the RTL design code;
a design violation pattern database to contain design violation patterns, wherein the design violation patterns identify violations relating to the simulation mismatches, synthesis mismatches, or ambiguous language semantics associated with generating the derived design that are otherwise undetected during equivalence checking between the derived design and the RTL design code; and
a design match engine configured to compare the RTL design code with the design violation patterns contained in the design violation pattern database, and
wherein the at least one processor is further configured to assign a rule object to a design pattern in the RTL design code, when the design match engine determines that the design pattern in the RTL design code matches one of the design violation patterns in the design violation pattern database, and to generate a violation report comprising the rule objects and their corresponding design violation patterns.

16. The system of claim 15, wherein the at least one processor is further configured to perform an equivalence check of the derived design compared to a golden RTL design for the electronic circuit design.

17. The system of claim 15, wherein the at least one processor is further configured to update the design violation pattern database with a new design violation pattern after the new design violation pattern has been determined to result in a design violation to the RTL design.

18. The system of claim 17, wherein the at least one processor is further configured to assign a design pattern violation number to the new design pattern violation.

19. The system of claim 15, wherein the violation report further comprises properties for each of the rule objects in the violation report.

20. The system of claim 19, wherein the properties comprise at least one of a name of a module containing the RTL design code corresponding to the rule object, a name of a file of the module, at least one line number of the RTL design code corresponding to the rule object, a design pattern violation number assigned to the design violation pattern corresponding to the rule object, and a textual description of the design violation pattern corresponding to the rule object.

21. The system of claim 15, wherein the at least one processor is further configured to:
select one of the rule objects is in the violation report,
graphically display at least a portion the RTL design code in a module containing the RTL design code corresponding to the selected rule object, and
hi-light the RTL design code corresponding to the selected rule object.

22. The system of claim 15, wherein the at least one processor is further configured to:
select hi-lighted RTL design code corresponding to one of the rule objects, and
graphically display the corresponding rule object in the violation report.

23. The system, of claim 15, wherein the at least one processor is further configured to:
select one of the rule objects in the violation report,
graphically display at least a portion the design schematic corresponding to the selected rule object, and
hi-light at least one of at least one unit and at least one connection corresponding to the selected rule object.

24. The system of claim 15, wherein the at least one processor is further configured to:
select at least one of a hi-lighted unit and a hi-lighted connection corresponding to one of the rule objects in a design schematic, and
graphically display at least a portion the RTL design code in a module containing the RTL design code corresponding to the selected at least one of the hi-lighted unit and the hi-lighted connection and hi-lights the RTL design code corresponding to the selected at least one of the hi-lighted unit and the hi-lighted connection.

25. The system of claim 15, wherein the at least one processor is further configured to:
  select at least one of a hi-lighted unit and a hi-lighted connection corresponding to one of the rule objects in a design schematic, and
  graphically display the corresponding rule object in the violation report.

26. The system of claim 15, wherein the at least one processor is further configured to categorize the design violation patterns into at least one design violation pattern category.

27. The system of claim 26, wherein the at least one design violation pattern category comprises at least one of a simulation and/or synthesis mismatches category and a design intent mismatch category.

28. The system of claim 26, wherein the at least one processor is further configured to calculate a design quality metric for the RTL design by using data obtained from the categorization of the design violation patterns corresponding to the rule objects.

* * * * *